(12) United States Patent
Saeki (10) Patent No.: US 7,372,137 B2
(45) Date of Patent: May 13, 2008

(54) SEMICONDUCTOR DEVICE AND MANUFACTURING METHOD THEREOF

(75) Inventor: Yoshihiro Saeki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 11/501,077

(22) Filed: Aug. 9, 2006

(65) Prior Publication Data

US 2007/0045791 A1 Mar. 1, 2007

(30) Foreign Application Priority Data

Aug. 29, 2005 (JP) .............................. 2005-247068

(51) Int. Cl.
*H01L 23/06* (2006.01)

(52) U.S. Cl. ...................... 257/684; 257/686; 257/666; 257/777

(58) Field of Classification Search .................. 257/72, 257/777, 684, 686, 666
See application file for complete search history.

(56) References Cited

U.S. PATENT DOCUMENTS

| | | | | |
|---|---|---|---|---|
| 5,886,396 A | * | 3/1999 | Carney et al. | 257/666 |
| 2003/0027373 A1 | * | 2/2003 | DiStefano et al. | 438/106 |
| 2004/0195572 A1 | * | 10/2004 | Kato et al. | 257/72 |
| 2004/0207485 A1 | * | 10/2004 | Kawachi et al. | 333/133 |
| 2005/0051903 A1 | * | 3/2005 | Ellsberry et al. | 257/777 |
| 2006/0214277 A1 | * | 9/2006 | Saeki | 257/684 |

FOREIGN PATENT DOCUMENTS

JP 10-112515 4/1998

* cited by examiner

*Primary Examiner*—Zandra V. Smith
*Assistant Examiner*—Telly D Green
(74) *Attorney, Agent, or Firm*—Volentine & Whitt, P.L.L.C.

(57) ABSTRACT

A semiconductor device includes a lower substrate having wiring patterns formed of a plurality of wirings, semiconductor chips located above the lower substrate and electrically connected to the wirings, an intermediate member which seals the semiconductor chips in columnar form and substantially, and a resin board which substantially covers the entire upper surface of the intermediate member. A thermal expansion coefficient of the resin board and a thermal expansion coefficient of the lower substrate are made approximately identical to each other.

19 Claims, 6 Drawing Sheets

SEMICONDUCTOR DEVICE AND MANUFACTURING METHOD THEREOF

BACKGROUND OF THE INVENTION

The present invention relates to a semiconductor device wherein semiconductor chips are electrically connected to a wiring board and sealed, and a manufacturing method thereof.

In a conventional semiconductor device, a plurality of circuit wirings are provided on a front surface of a wiring board formed of a glass epoxy resin. Semiconductor chips are electrically connected to the circuit wirings and mounted thereto. The semiconductor chips mounted onto the wiring board are sealed with a first encapsulating resin layer such as a resin approximately equal to the wiring board in thermal expansion coefficient. The first encapsulating resin layer is heated and temporarily cured. After the temporary curing of the first encapsulating resin layer, a second encapsulating resin layer comprised of a high Tg resin made coincident with the wiring board in thermal expansion coefficient is applied so as to reach a thickness similar to that of the wiring board. Then, the first and second encapsulating resin layers are heat and cured and external terminals are formed on the back surface of the wiring board, whereby the above semiconductor device is manufactured. Excessive thermal expansion of the first encapsulating resin layer exceeding a glass transition temperature Tg upon heat treatment in a reflow process at the mounting of the semiconductor device on a mounting board is suppressed by the second encapsulating resin layer which does not exceed the glass transition temperature Tg, thereby preventing warpage of the semiconductor device.

After the temporary curing of the first encapsulating resin layer, a high rigidity member comprised of a metal or the like smaller than a range in which a resin encapsulating layer is applied is disposed on the first encapsulating resin layer. Thereafter, the second encapsulating resin layer is applied and thermoset to enhance the rigidity of the semiconductor device, thereby preventing the warpage of the semiconductor device in the reflow process (refer to, for example, a patent document 1 (Japanese Unexamined Patent Publication No. Hei 10-112515 (paragraph 0019 in page 4 to paragraph 0031 in page 5 and paragraphs 0031 to 0033 in page 5, and FIGS. 1 and 3)).

In the above patent document 1, the semiconductor chips mounted on the wiring board formed of the glass epoxy resin are sealed with the encapsulating resin layer approximately equal to the wiring board in thermal expansion coefficient. Therefore, even though the encapsulating resin layer is heated and cured in the sealing process step, no warpage occurs at that time, whereas when the thermal expansion coefficient of the wiring board is smaller than that of the encapsulating resin layer, warpage caused by the difference in thermal expansion coefficient at the cooling subsequent to the heating/curing of the encapsulating resin layer in the sealing process step, that is, dish-shaped warpage occurs due to more shrinkage of the encapsulating resin layer at the cooling subsequent to the heating/cooling.

In order to prevent such dish-shaped warpage, the present applicant has proposed a technique wherein in Japanese patent application No. 2005-87644, when semiconductor chips are mounted on a wiring board such as a silicon substrate small in thermal expansion coefficient and sealed with an encapsulating resin layer, a metal plate or sheet formed of a material having a thermal expansion coefficient approximately equal to that of a silicon substrate or the like such as a metal plate is provided on the opposite side of the silicon substrate or the like to thereby prevent the dish-shaped warpage of the semiconductor device.

Incidentally, the high rigidity member formed of the metal or the like (having about half length according to FIG. 3 of the patent document 1) smaller than the range in which the encapsulating resin layer is applied, is disposed on the first encapsulating resin layer after the temporary curing of the first encapsulating resin layer in the above patent document 1. Therefore, even though the second encapsulating resin layer is thereafter applied and thermoset, the wiring board and the high rigidity member are set to the same degree in the amount of shrinkage because the length of the high rigidity member less than or equal to half in thermal expansion coefficient is set to about half the length of the wiring board, thus causing no problem referred to above.

However, the patent document 1 is accompanied by problems that when the technique of the patent document 1 is used in the semiconductor device in which there is the difference in thermal expansion coefficient between the wiring board and the encapsulating resin layer, more warpage occurs on the shrunk side at the cooling subsequent to the heat treatment for heating/curing when the wiring board equipped with the semiconductor chips is sealed with the encapsulating resin layer in the sealing process step at its manufacture and it is heated/cured and cooled, and when the thermal expansion coefficient of the wiring board is smaller than that of the encapsulating resin layer, the dish-shaped warpage occurs, whereas when the thermal expansion coefficient of the wiring board is large than it, shallow bell-shaped warpage occurs.

With the occurrence of such warpage, the wiring board or the like cannot be held reliably when the wiring board formed with the encapsulating resin layer is held on a working table or the like by suction under vacuum in the external terminal forming process step subsequent to the sealing process step. Further, the formation of the external terminals might become difficult. When the wiring board or the like is held on the working table or the like by a mechanical clamp apparatus, cracks occur in the wiring board or the like because the force trying to correct the warpage acts.

This occurs even in a dividing process step at the time that a plurality of semiconductor devices are simultaneously formed and divided into fractions or pieces. Their retention might be incomplete when they are applied onto a dicing sheet having adhesion to divide them into the fractions.

The above results in a reduction in the manufacturing efficiency of the semiconductor device.

SUMMARY OF THE INVENTION

The present invention has been made to solve the foregoing problems. An object of the present invention is to provide means for reducing warpage of a semiconductor device where a wiring board is different from an encapsulating resin layer in thermal expansion coefficient.

According to one aspect of the present invention, for attaining the above object, there is provided a semiconductor device comprising a lower substrate having wiring patterns formed of a plurality of wirings, semiconductor chips located above the lower substrate and electrically connected to the wirings, an intermediate member which seals the semiconductor chips in columnar form and substantially, and an upper board which substantially covers the entire upper surface of the intermediate member, wherein a thermal expansion coefficient of the upper board is approximately identical to that of the lower substrate.

Thus, the present invention can obtain an advantageous effect that since the lower substrate and the upper board disposed above and below the intermediate member are shrunk to the same degree even though the lower substrate is much shrunk as compared with the intermediate member upon cooling subsequent to heat treatment in the sealing process step, warpage of the semiconductor device can be suppressed.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of a semiconductor device and a manufacturing method thereof according to the present invention will hereinafter be explained referring to the accompanying drawings.

First Preferred Embodiment

Figure 1:
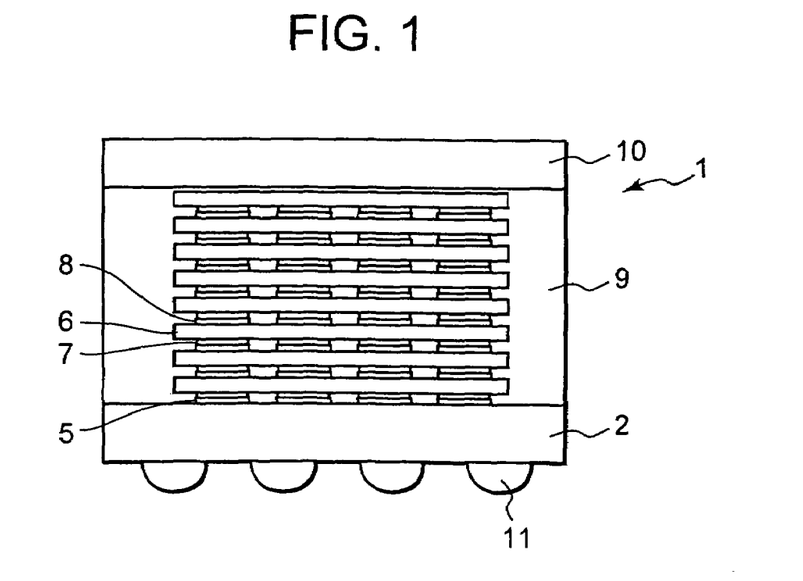
FIG. 1 is an explanatory view showing a section of a semiconductor device according to a first embodiment.
Figure 2:
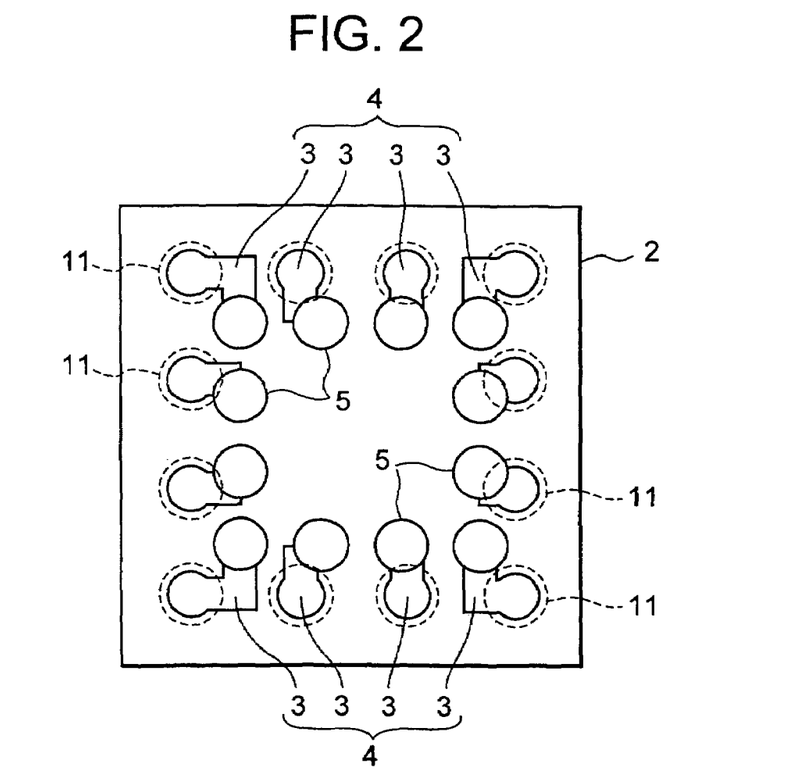
FIG. 2 is an explanatory view illustrating a top surface of a wiring board employed in the first embodiment.

FIG. 1 is an explanatory view showing a section of a semiconductor device according to a first embodiment, and FIG. 2 is an explanatory view showing a top surface of a wiring board employed in the first embodiment.

In FIG. 1, reference numeral 1 indicates the semiconductor device.

Reference numeral 2 indicates the wiring board used as a lower substrate, which is a substrate formed of a glass epoxy resin that contains whisker composed of glass fiber or has fabric comprised of glass fiber embedded therein. Wiring patterns 4 each constituted of a plurality of wirings 3 shown in FIG. 2 are formed on the front surface of the substrate. Substrate ball pads 5 are formed at their corresponding predetermined portions of the wirings 3.

A thermal expansion coefficient $\alpha_a$ of the wiring board 2 comprised of the glass epoxy resin employed in the present embodiment ranges from 12 to $16 \times 10^{-6}/°$ C. or so.

Reference numerals 6 indicate semiconductor chips. A plurality of bumps 7 are disposed on a lower surface of each semiconductor chip, and a plurality of chip ball pads 8 are disposed on its upper surface. The bumps 7 of the semiconductor chip 6 corresponding to the undermost layer are electrically connected to their corresponding substrate ball pads 5 formed on the wirings 3 in a flip-chip system. The plurality of semiconductor chips 6 are laminated above the semiconductor chip 6 corresponding to the undermost layer in such a manner that the chip ball pads 8 and the bumps 7 are electrically connected to one another in the flip-chip system. In the present embodiment, the semiconductor chips 6 are laminated in the form of eight layers.

Reference numeral 9 indicates an encapsulating resin layer used as an intermediate member. The encapsulating resin layer is a columnar member having a sectional area approximately identical to the area of the wiring board 2, which is formed by charging a sealant 9a obtained by melting a resin material between the laminated semiconductor chips 6, between the semiconductor chip 6 corresponding to the undermost layer and the wiring board 2, between the semiconductor chip 6 corresponding to the top layer and a resin board 10 and around the laminated semiconductor chips 6 and heating and curing the sealant 9a. The columnar member has the function of protecting between the semiconductor chips 6 and the like and ensuring electrical insulating properties and the function of protecting the semiconductor chip 6 and the wiring patterns 4 and the like from outside.

In this case, the encapsulation by the encapsulating resin layer 9 may be placed in a state in which some voids are formed. In brief, its encapsulation is enough if substantially done so as to carry out the above functions.

The encapsulating resin layer 9 employed in the present embodiment is formed by charging, by injection molding, a sealant 9a obtained by melting a granulated epoxy resin used for injection molding. A thermal expansion coefficient $\alpha_b$ thereof ranges from about 6 to $10 \times 10^{-6}/°$ C. and is smaller than the thermal expansion coefficient $\alpha_a$ of the wiring board 2 comprised of the glass epoxy resin.

The resin board 10 used as an upper board is a plate-shaped member that has a thickness substantially identical to that of the wiring board 2 and is formed of a resin having a thermal expansion coefficient $\alpha_c$ approximately identical to the wiring board 2. The resin board 10 is disposed so as to cover all the upper surface of the columnar encapsulating resin layer 9 which has sealed the laminated semiconductor chips 6.

In order to enhance adhesion to the encapsulating resin layer 9, the lower surface of the resin board 10, i.e., the surface on the encapsulating resin layer 9 side is subjected to surface treatment for bringing the surface of the resin board into a stain-like state by a chemical method such as etching or a mechanical method such as shot peening.

The resin board 10 employed in the present embodiment is a plate-like member having a thickness substantially identical to the wiring board 2 formed of the glass epoxy resin. Its thermal expansion coefficient $\alpha_c$ is identical to the wiring board 2 comprised of the same material.

Reference numerals 11 indicate external terminals, which are terminals disposed on the back surface of the wiring board 2 and formed of a material such as a solder alloy, which are electrically connected to predetermined wirings 3 on the front surface of the wiring board 2. The external terminals 11 have the function of electrically connecting the semiconductor device 1 and mounting terminals of an unillustrated mounting board.

The semiconductor device 1 according to the present embodiment comprises the square wiring and resin boards 2 and 10 each having a thickness of 0.15 mm and one side of 12 mm, the semiconductor chips 6 laminated eight between these and each shaped in the form of a square whose one side is 10 mm, and the 0.56-thic columnar encapsulating resin layer 9 which seals the semiconductor chips 6.

Figure 3:
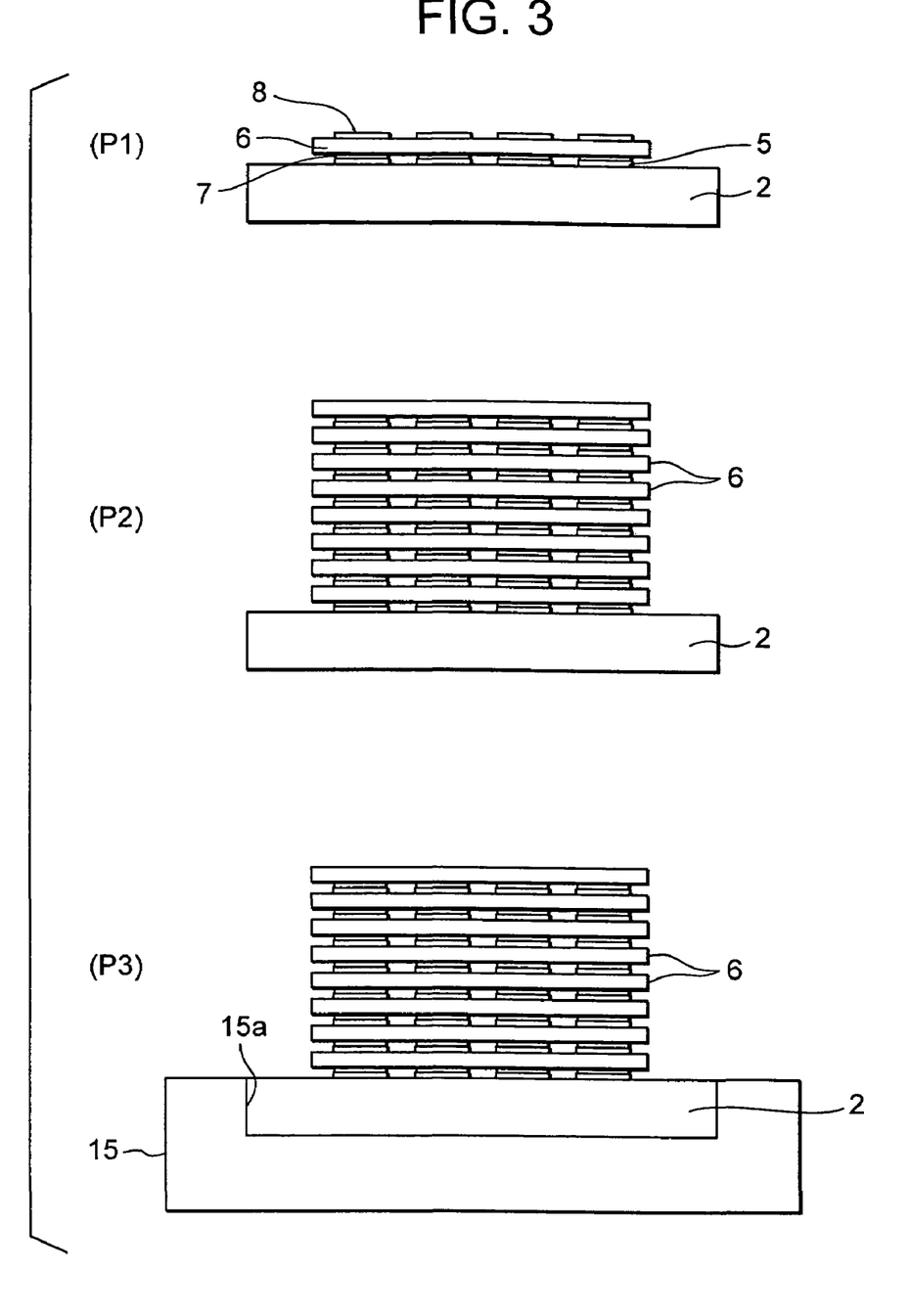
FIG. 3 is an explanatory view depicting a method of manufacturing the semiconductor device according to the first embodiment.
Figure 4:
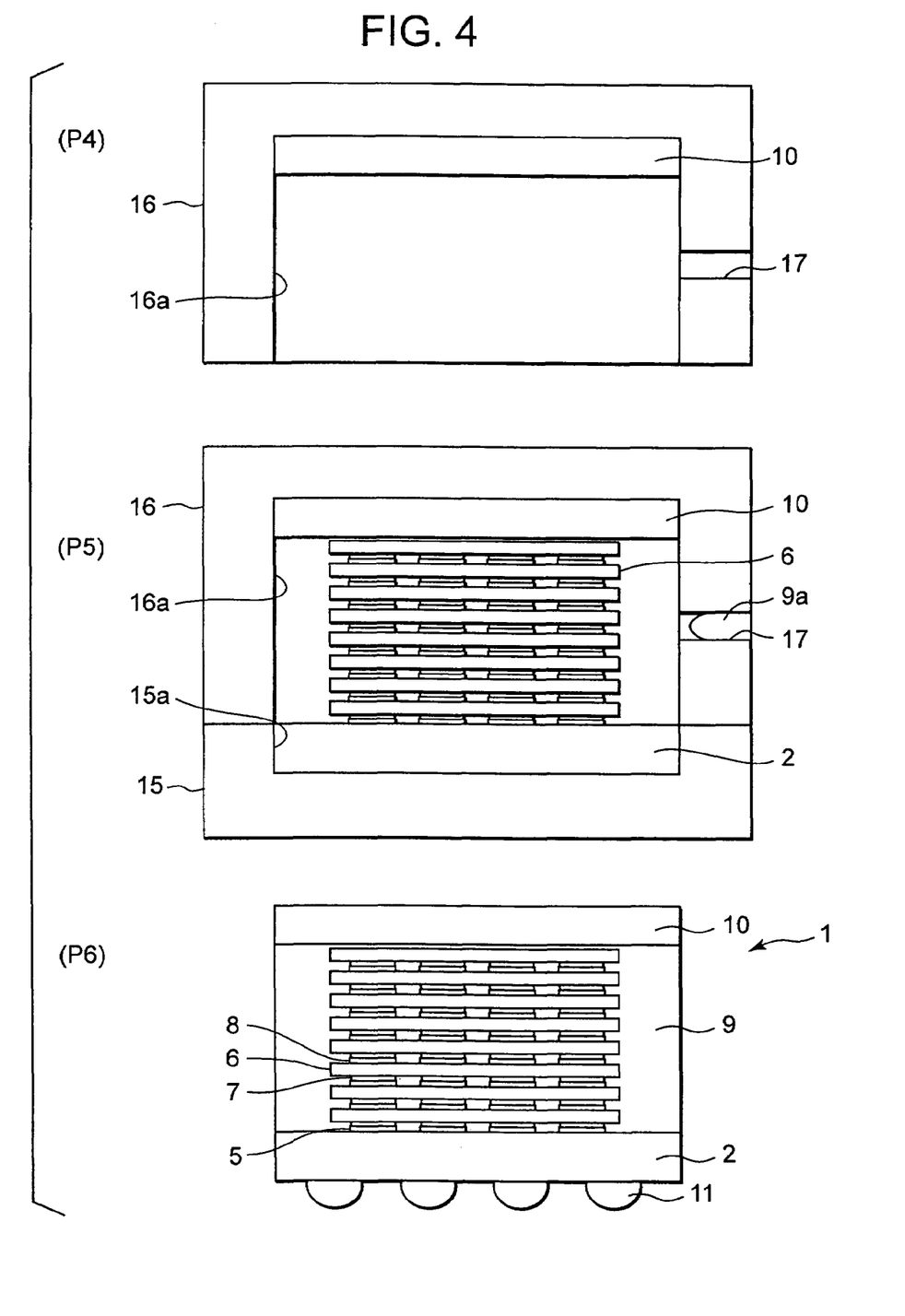
FIG. 4 is an explanatory view showing the method of manufacturing the semiconductor device according to the first embodiment.

FIGS. 3 and 4 are respectively explanatory views showing a method of manufacturing the semiconductor device according to the first embodiment.

In FIGS. 3 and 4, reference numerals 15 indicates a lower die that is a rectangular die which has an opening or aperture having a size approximately identical to the size of the wiring board 2, for fitting the wiring board 2 therein and mounting it therein, and which is provided with a substrate mounting hole 15a having a depth approximately identical to the thickness of the wiring board 2.

Reference numeral 16 indicates an upper die that is a rectangular die which has an opening or aperture having a size approximately identical to the size of the resin board 10, for fitting the resin board 10 therein and mounting it therein and which is provided with an upper board mounting hole 16a having a depth approximately identical to a thickness obtained by adding together the thickness of the resin board 10 and the thickness of an encapsulating resin layer 9 to be formed. The upper die is provided with an injection hole 17 for injecting the sealant 9a into its one sidewall and combined with the lower die 15 thereabove.

The upper die 16 is provided with unillustrated push pins for holding the resin board 10 at the bottom face of the upper board mounting hole 16a.

The method of manufacturing the semiconductor device according to the present embodiment will be explained below in accordance with process steps or processes indicated by P using FIGS. 3 and 4.

At P1 (see FIG. 3), a wiring board 2 formed with substrate ball pads 5 at predetermined portions or regions of wiring patterns 4 formed on its upper surface by a plurality of wirings 3 is prepared. Bumps 7 provided on the lower surface of a semiconductor chip 6 corresponding to the undermost layer are placed on their corresponding substrate ball pads 5 provided on the wirings 3, in alignment with the substrate ball pads 5.

At P2 (see FIG. 3), the bumps 7 of the immediately-above semiconductor chip 6 are placed over their corresponding chip ball pads 8 provided on the upper surface of the semiconductor chip 6 placed on the substrate ball pads 5, in alignment with the chip ball pads 8. Likewise, semiconductor chips 6 are placed in order. Thereafter, the bumps 7 are heated and melted to join the respective semiconductor chips 6 to one another and join the semiconductor chip 6 of the undermost layer and the wirings 3 of the wiring board 2 to each other, whereby the semiconductor chips 6 laminated over the wiring board 2 in a flip-chip system and the wirings 3 of the wiring patterns 4 provided on the wiring board 2 are electrically connected to one another.

At P3 (see FIG. 3), the wiring board 2 with the laminated semiconductor chip 6 mounted thereon is fitted and mounted in the substrate mounting hole 15a of the lower die 15.

At P4 (see FIG. 4), an additionally prepared resin board 10 is fitted in its corresponding upper die 16 with its lower surface being directed to the encapsulating resin layer 9 side.

The resin board 10 is mounted on the bottom face of the upper board mounting hole 16a with being held at its bottom face.

At P5 (see FIG. 4), the lower die 15 with the wiring board 2 mounted onto an injection molding machine and the upper die 16 with the resin board 10 mounted thereto are placed in combination. Thereafter, a melted liquid sealant 9a is injected through an injection hole 17 so as to be charged between the laminated semiconductor chips 6, between the semiconductor chip 6 of the undermost layer and the wiring board 2 and between the semiconductor chip 6 of the uppermost layer and the resin board 10, and around the laminated semiconductor chips 6. Thereafter, the sealant 9a is heat-treated at a temperature ranging from about 160° C. to 200° C. to heat and cure it, thereby forming a columnar encapsulating resin layer 9.

Thus, the wiring board 2 and the resin board 10, and the encapsulating resin layer 9 are bonded to one another by bonding action of the encapsulating resin layer 9.

At P6 (see FIG. 4), the upper die 16 is made open after the curing of the encapsulating resin layer 9 to take out the wiring board 2 formed with the encapsulating resin layer 9 having sealed the semiconductor chips 6 laminated between the wiring board 2 and the resin board 10 from the lower die 15. After its cooling, the wiring board 2 is held on an unillustrated working table or the like by suction or the like placed under vacuum or negative pressure, whereby external terminals 11 are formed on the back surface of the wiring board 2 by solder balls or the like.

The semiconductor device 1 according to the present embodiment in which the plural semiconductor chips 6 sealed with the columnar encapsulating resin layer 9 are laminated between the wiring board 2 and the resin board 10, is manufactured in this way.

The semiconductor device 1 manufactured in the above-described manner is cured in a state in which the entire upper surface of the encapsulating resin layer 9 is covered with the resin board 10 upon heating and curing of the encapsulating resin layer 9. Thereafter, the semiconductor device 1 is cooled in a state in which the encapsulating resin layer 9 is being interposed between the resin board 10 and the wiring board 2 having the same thermal expansion coefficient and approximately identical to each other in size. Therefore, even though the wiring board 2 is shrunk with a relatively large thermal expansion coefficient, the wiring board 2 and the resin board 10 placed above and below the encapsulating resin layer 9 are shrunk with the same degree to prevent warpage of the semiconductor device 1. Thus, no warpage occurs in the sealing process step and no trouble occurs in the retention of the external terminals 11 in their forming process step. Further, no warpage occurs even in heat treatment in a process step for mounting the semiconductor device 1 onto a mounting board. It is thus possible to enhance the manufacturing efficiency of the semiconductor device.

This is particularly effective where the encapsulating resin layer 9 is thicker than the wiring board 2 in thickness and dominant over the warpage.

Since the lower surface of the resin board 10 is given stain-like plating to enhance adhesion between the encapsulating resin layer 9 and the resin board 10, the resin board 10 is prevented from being peeled off from the encapsulating resin layer 9 by shearing stress developed at the interface between the encapsulating resin layer 9 and the resin board 10 due to the difference between their relatively large thermal expansion coefficients.

Further, since the resin board makes use of the same material as the wiring board, the time required to perform a confirmation test or the like on the warpage of the semiconductor device can be shortened.

Furthermore, since the wiring board 2 and the resin board 10 are formed of the same material so as to be identical in vertical modulus of elasticity E, and their thicknesses are made approximately equal so as to be identical in flexural rigidity, the flexural rigidity of the resin board 10 is not made excessive to the wiring board 2 and the warpage of the wiring board 2 due to the local shrinkage of the encapsulating resin layer 9 on the wiring board 2 side does not occur.

Incidentally, although the resin board 10 has been described as being identical in size to the wiring board 2 in the present embodiment, the junction areas of the resin board 10, the wiring board 2 and the encapsulating resin layer 9 may be approximately identical and the sizes of the resin board 10 and the wiring board 2 need not to exactly coincide with each other.

In the present embodiment as described above, the semiconductor chips mounted over the wiring board are sealed with the columnar encapsulating resin layer smaller than the wiring board in thermal expansion coefficient, and the thermal expansion coefficient of the resin board having sealed all the upper surface of the encapsulating resin layer is set identical to the wiring board. Thus, since the wiring board and the resin board disposed above and below the encapsulating resin layer are shrunk with the same degree even though the wiring board is much shrunk as compared with the encapsulating resin layer upon cooling subsequent to the heat treatment in the sealing process step, the warpage of the semiconductor device can be suppressed.

The wiring board and the resin board are set approximately identical in thickness to each other. Therefore, the wiring board and the resin board can be made approximately equal in flexural rigidity, and hence the warpage of the semiconductor device due to the difference in flexural rigidity can be suppressed.

Further, the semiconductor chips laminated over the wiring board and the resin board are simultaneously sealed by the combination of the upper die and the lower die. It is therefore possible to shorten the time required to manufacture the semiconductor device.

Furthermore, the semiconductor chips are electrically connected in the flip-chip system. It is thus possible to simplify the manufacturing process exclusive of a wire bonding process step and make space for connection of wires unnecessary. Thus, the semiconductor device can be reduced in size.

Second Preferred Embodiment

Figure 5:
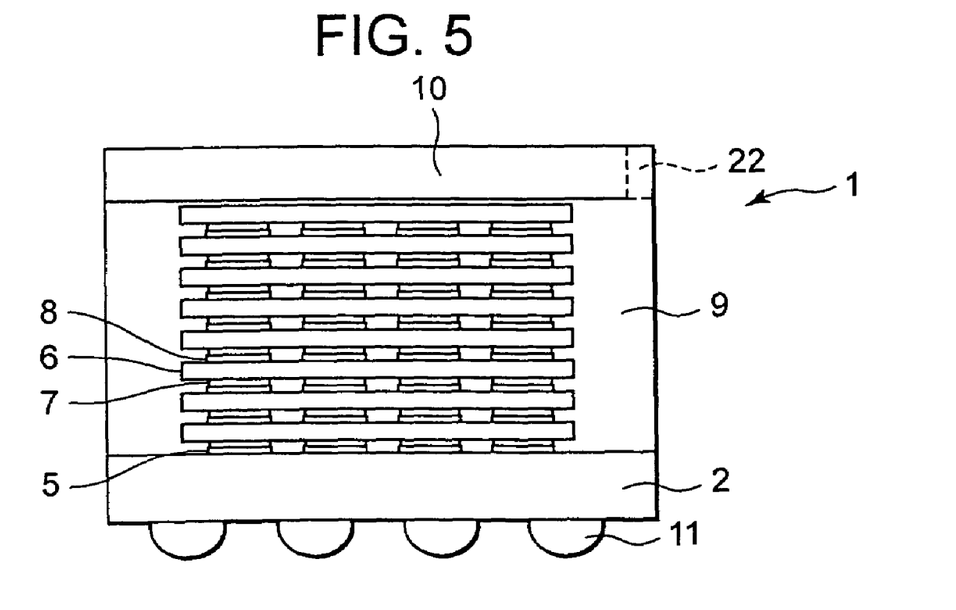
FIG. 5 is an explanatory view illustrating a section of a semiconductor device according to a second embodiment.
Figure 6:
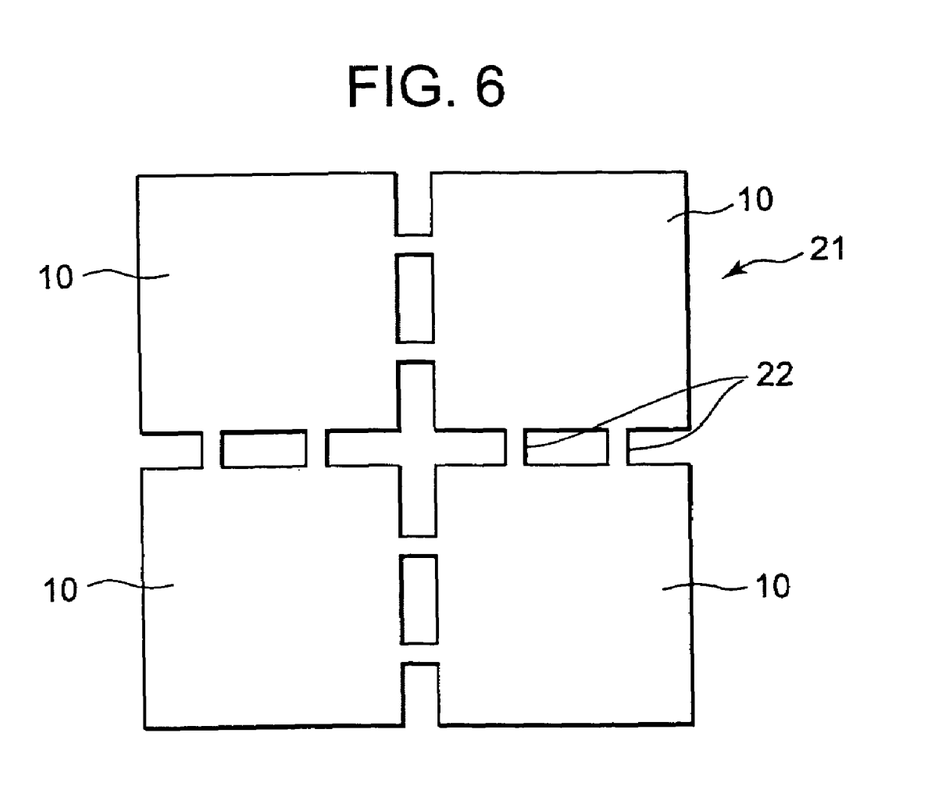
FIG. 6 is an explanatory view depicting a top surface of a resin board body employed in the second embodiment.

FIG. 5 is an explanatory view showing a section of a semiconductor device according to a second embodiment, and FIG. 6 is an explanatory view showing a top surface of a resin board body employed in the second embodiment.

Incidentally, constituent elements or portions similar to those employed in the first embodiment are given the same reference numerals, and their description will be omitted.

In FIGS. 5 and 6, reference numeral 21 indicates a resin board body used as an upper board, which is configured by connecting plural resin boards 10 similar to the first embodiment to one another by slender connecting portions 22 formed of the same material as the resin boards 10. The resin board body is formed to approximately the same size as the wiring board 2 employed in the present embodiment by injection molding or the like.

The resin board body 21 employed in the present embodiment is configured in such a manner that the four resin boards 10 are disposed in matrix form and sides thereof set face to face with each other are connected to one another by the two connecting portions 22. The lower surface of the resin board body 21 is given surface treatment similar to the first embodiment.

Thus, the wiring board 2 employed in the present embodiment is a substrate or board having an area equal to approximately four times that of the wiring board 2 employed in the first embodiment in which four wiring patterns 4 are arranged in matrix form in association with the resin boards 10 of the resin board body 21.

Figure 7:
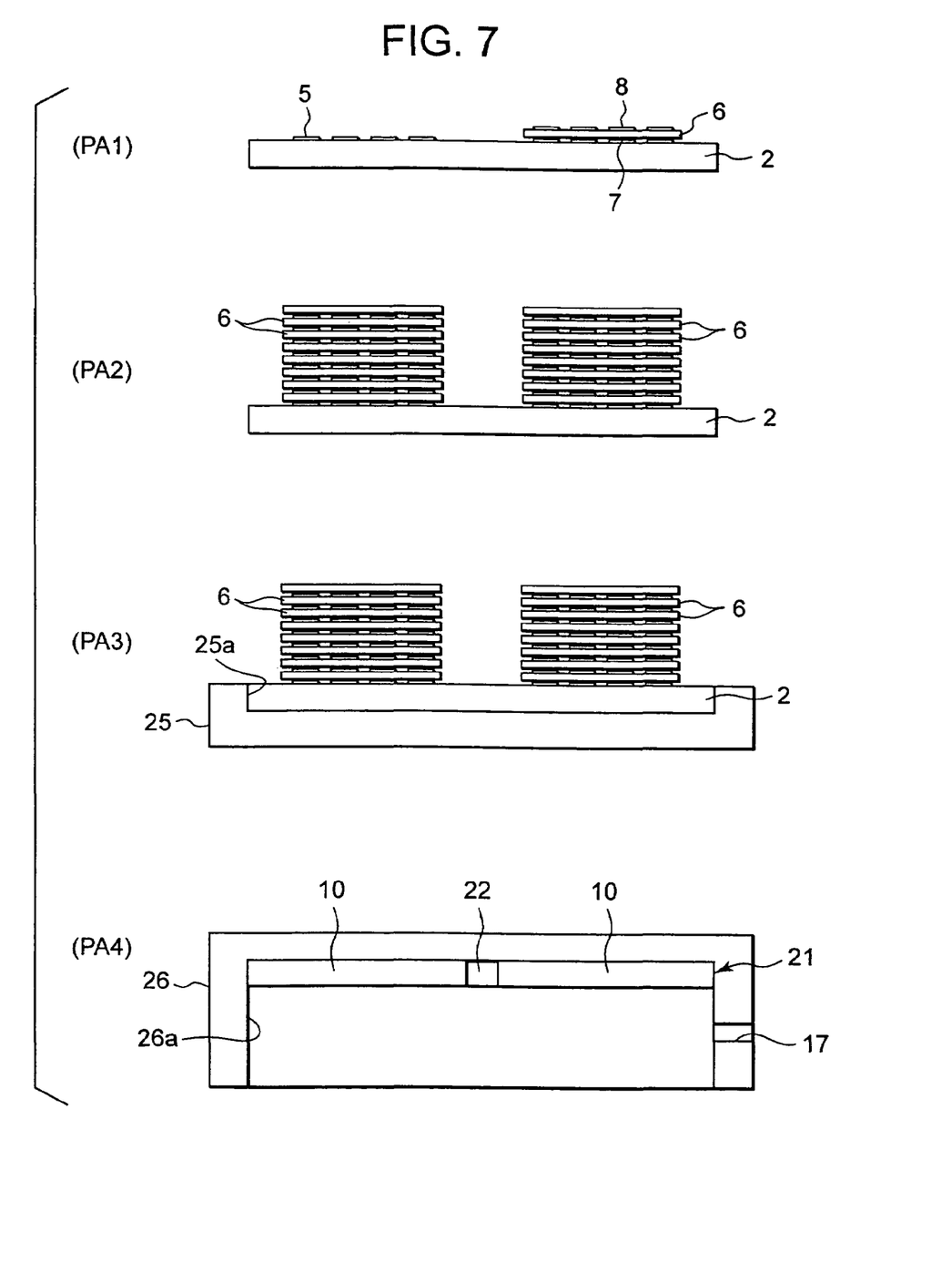
FIG. 7 is an explanatory view showing a method of manufacturing the semiconductor device according to the second embodiment.
Figure 8:
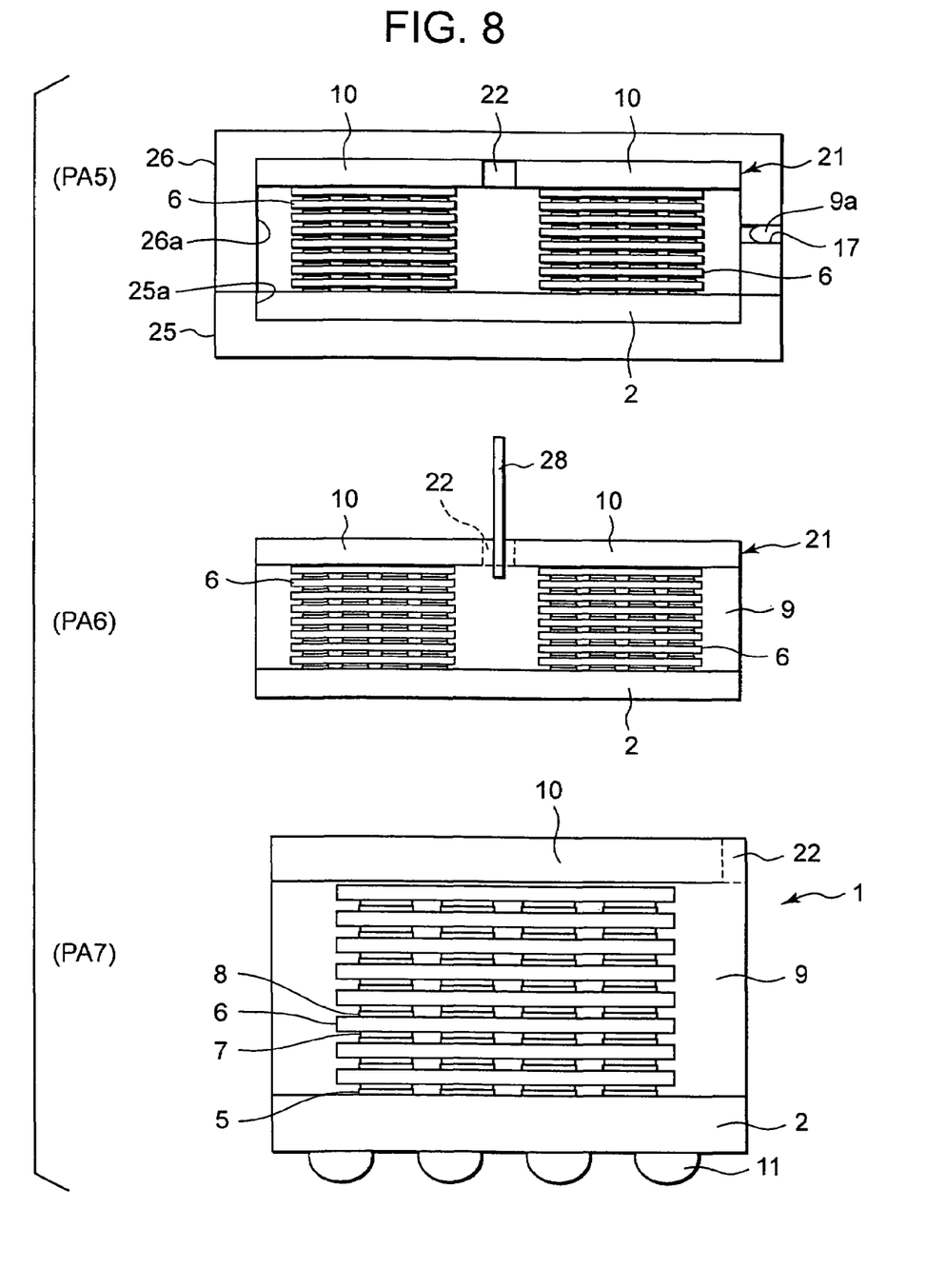
FIG. 8 is an explanatory view illustrating the method of manufacturing the semiconductor device according to the second embodiment.

FIGS. 7 and 8 are respectively explanatory views showing a method for manufacturing the semiconductor device according to the second embodiment.

In FIGS. 7 and 8, reference numeral 25 indicates a lower die, which is a die similar to the lower die 15 of the first embodiment and different therefrom in that an opening of a substrate mounting hole 25a is approximately equal in size to the wiring board 2 of the present embodiment.

Reference numeral 26 indicates an upper die, which is a die similar to the upper die 16 of the first embodiment and different therefrom in that an upper board mounting hole 26a having an opening of a size approximately equal to the size of a resin board body 21, for fitting the resin board body 21 therein and mounting it therein is provided.

Reference numeral 28 indicates a dicing blade, which is a thin grinding stone formed of abrasive grains of diamond.

The method for manufacturing the semiconductor device according to the present embodiment will be explained below in accordance with processes indicated by PA using FIGS. 7 and 8.

At PA1 (see FIG. 7), a wiring board 2 formed with a plurality of wiring patterns 4 at its upper surface and substrate ball pads 5 at predetermined portions of the wiring patterns 4 is prepared. In a similar to the process P1 of the first embodiment, a semiconductor chip 6 corresponding to the undermost layer is placed on a predetermined portion of one wiring pattern 4 of the wiring board 2. Likewise, semiconductor chips 6 each corresponding to the uppermost layer are placed on their corresponding predetermined portions of other wiring patterns 4.

At PA2 (see FIG. 7), semiconductor chips 6 are placed over the respective semiconductor chips 6 of the undermost layers in order in a manner similar to the process P2 of the first embodiment. Thereafter, bumps 7 are heat and melted to laminate the semiconductor chips 6 over the respective wiring patterns 4. Then, the semiconductor chips 6 each laminated in a flip-chip system are respectively electrically connected to wirings 3 of the wiring patterns 4.

At PA3 (see FIG. 7), the wiring board 2 is fitted and mounted in the substrate mounting hole 25a of the lower die 25 in a manner similar to the process P3 of the first embodiment.

At PA4 (see 7), an additionally prepared resin board body 21 is fitted in the upper die 26 and held at and mounted onto the bottom face of the upper board mounting hole 26a in a manner similar to the process P4 of the first embodiment.

At PA5 (see FIG. 8), in a manner similar to the process P5 of the first embodiment, a sealant 9a is injected through an injection hole 17 for the combined lower and upper dies 25 and 26 so as to be charged between the laminated semiconductor chips 6, between each semiconductor chip 6 of the undermost layer and the wiring board 2 and between each semiconductor chip 6 of the uppermost layer and the resin board body 21, and around the laminated semiconductor chips 6 and at portions excluding connecting portions 22 between the adjacent resin boards 10 of the resin board body 21. Thereafter, the sealant 9a is heated and cured to form an encapsulating resin layer 9.

Thus, the wiring board 2 and the resin board body 21, and the encapsulating resin layer 9 are bonded to one another by bonding action of the encapsulating resin layer 9.

At PA6 (see FIG. 8), the upper die 16 is made open after the curing of the encapsulating resin layer 9 to take out the wiring board 2 formed with the encapsulating resin layer 9 having sealed the plural laminated semiconductor chips 6 between the wiring board 2 and the resin board body 21 from the lower die 25. After its cooling, the wiring board 2 is applied onto and held at an unillustrated stage or the like by a dicing sheet or the like having adhesion. The resin board body 21, the encapsulating resin layer 9 and the wiring board 2 are cut and fractionalized in such a manner that the wiring board 2 is cut at approximately the centers of the connecting portions 22 of the resin board body 21 by the dicing blade from above the resin board body 21, i.e., one of the wiring patterns 4 of the wiring board 2 is contained.

At PA7 (see FIG. 8), external terminals 11 are thereafter formed on the back surfaces of the wiring boars 2 divided into fractions in a manner similar to the process P6 of the first embodiment.

In this case, the wiring board 2 may be divided into the fractions after the external terminals 11 are formed on the lower surface of the wiring board 2 taken out from the die at the process PA6.

Thus, the semiconductor device 1 according to the present embodiment is manufactured wherein the plurality of semiconductor chips 6 sealed between the wiring board 2 and the resin board 10 by the columnar encapsulating resin layer 9 are laminated on one another.

The semiconductor device 1 manufactured in the above-described manner is cured in a state in which the entire upper surface of the encapsulating resin layer 9 is covered with the resin board body 21 upon thermosetting of the encapsulating resin layer 9. Thereafter, the semiconductor device 1 is cooled in a state in which the encapsulating resin layer 9 is being interposed between the resin board body 21 and the wiring board 2 having the same thermal expansion coefficient and approximately identical to each other in size. Therefore, even though the wiring board 2 is shrunk with a relatively large thermal expansion coefficient, the wiring board 2 and the resin board body 21 placed above and below the encapsulating resin layer 9 are shrunk with the same degree to prevent warpage of the semiconductor device 1. Thus, no warpage occurs in the sealing process step and no trouble occurs in the dividing process step for dividing the wiring board into the fractions and in the retention of the external terminals 11 in their forming process step. Further, no warpage occurs even in heat treatment in a process step for mounting the semiconductor device 1 onto a mounting board. It is thus possible to enhance the manufacturing efficiency of the semiconductor device.

A plurality of the resin boards 10 are connected by the connecting portions 22 to form a plurality of the semiconductor devices 1 at a time. Thereafter, they are divided into the fractions to manufacture the semiconductor devices 1. Therefore, the time required to manufacture each semiconductor device 1 can be shortened and the portions of the resin board body 21 to be cut by the dicing blade can be limited to the connecting portions 22. Hence, deformation of the cut portions due to burrs and sags can be prevented.

Further, in the semiconductor device 1 according to the present embodiment, the upper surface of the encapsulating resin layer 9 is covered with the resin boards 10 placed in a state in which the cut connecting portions 22 are partly left. However, the length obtained by adding the lengths of the resin boards 10 and the connecting portions 22 left by cutting is set approximately identical to the length of the wiring board 2, and the entire upper surface of the encapsulating resin layer 9 is substantially covered in this condition. Further, each of the resin boards 10 acts in a manner similar to the resin board 10 of the first embodiment that covers the entire upper surface of the encapsulating resin layer 9. Therefore, no warpage occurs in the semiconductor device 1.

Incidentally, although the resin board body 21 has been explained in the present embodiment as one in which the resin boards 10 are disposed in matrix form and connected by the connecting portions 22, the layout of the resin boards 10 is not limited to the above. The resin board body 21 may be a strip-like resin board body 21 in which the resin boards 10 are linearly connected by the connecting portions 22, or a board in which a plurality of resin boards 10 are connected without providing the connecting portions 22, i.e., a resin board body 21 comprising a sheet of board or plate having a size equivalent to the number of semiconductor devices 1 to be formed.

Although the number of the connecting portions 22 has been described as being two, one, or three or more may be provided.

Further, although the resin board body 21 has been described as one configured by connecting the four resin boards 10 by the connecting portions 22, the number of the resin boards 10 that constitute the resin board body 21 may be any number if the resin boards 10 are provided plural. Alternatively, one in which a large number of resin boards 10 are connected by their corresponding connecting portions 22 and arranged in matrix form, may be used as a resin board body 21 having a size similar to a semiconductor wafer.

Further, although the present embodiment has explained where the wiring board 2 and like are fractionalized by cutting using the dicing blade to manufacture the semiconductor devices 1, they may be brought into fractionization by, for example, cutting using laser or cutting using a pressing machine to thereby manufacture the semiconductor devices 1.

In the present embodiment as described above, in addition to the effects similar to the first embodiment, the wiring board having the plural wiring patterns, and the resin board body in which the plural resin boards are connected by the connecting portions, are used. The upper die and the lower die are combined together and sealed at a time. The so-obtained product is brought into fractionization to manufacture the semiconductor devices. Therefore, the time required to manufacture the semiconductor devices can be shortened and the portions of the resin board body to be cut by the dicing blade can be limited to the connecting portions. Hence, it is possible to prevent deformation of the cut portions due to burrs and sags.

Incidentally, although the semiconductor device in which the plurality of semiconductor chips are laminated in the form of eight layers, has been explained in each of the above embodiments, the laminated semiconductor chips may be large or small in number as compared with the above. Even in the case of one layer, effects similar to the above can be obtained.

Although each of the above embodiments has described where the bumps placed on the lower surface of each semiconductor chip are respectively bonded to the chip ball pads placed on the upper surface of the semiconductor chip corresponding to the layer placed therebelow, the semiconductor chip is turned upside down and the bumps placed on the upper surface of the semiconductor chip may be bonded to their corresponding chip ball pads placed on the lower surface of the semiconductor chip corresponding to the upper layer. Alternatively, bumps are formed on both surfaces of each semiconductor chip and may be bonded to one another. When the semiconductor chip is reversed in this case, the bumps are formed in place of substrate ball pads placed on wirings of wiring patterns.

Further, although each of the above embodiments has explained where one semiconductor device is provided with the semiconductor chips laminated as one, the semiconductor chips respectively laminated at plural points of the wiring patterns of the wiring board may be bonded to one another to configure one semiconductor device.

Furthermore, although each of the above embodiments has explained where the upper die is provided with the push pins to hold the resin board, the top board of the upper die may be provided with a suction hole to hold the resin board by suction under vacuum.

Still further, each of the above embodiments has explained where the upper die is combined with the lower die thereabove and the sealant is injected through the injection hole to form the encapsulating resin layer. However, the upper die equipped with the resin board or the resin board body is provided down without providing the injection hole, and the sealant is charged into its upper board mounting hole or substrate mounting hole. The wiring board with the laminated semiconductor chips mounted thereon is held in the lower die and the sealant is immersed from the semiconductor chip side to combine the upper and lower dies. Thereafter, the sealant may be heated and cured to form the encapsulating resin layer.

Still further, although each of the above embodiments has explained where the resin board used as the upper board is of the glass epoxy resin larger than the encapsulating resin layer in thermal expansion coefficient and is the same material as the wiring board, the material for the upper board is not limited to the glass epoxy resin. If materials such as a metal approximately identical to one another in thermal expansion coefficient are used, then any material may be used. As the materials, may be mentioned, for example, a stainless plate (whose thermal expansion coefficient $\alpha_c=17.3\times10^{-6}/°$ C. or so), a brass plate (whose thermal expansion coefficient $\alpha_c=17.5\times10^{-6}/°$ C. or so), a bronze plate (whose $\alpha_c=17.3\times10^{-6}/°$ C. or so), aluminum bronze (whose thermal expansion coefficient $\alpha_c=15.9\times10^{-6}/°$ C. or so), a copper plate (whose thermal expansion coefficient $\alpha_c=16.5\times10^{-6}/°$ C. or so), or the like. When a metal plate or board is used as the upper board and larger than the glass epoxy resin in vertical modulus of elasticity E, the thickness of the metal plate is made thin and they may preferably be set approximately identical to each other in flexural rigidity.

In this case, the surface treatment given to the lower surface of the metal plate may also be stain-like plating. In brief, any one may be adopted if such one that fine depressions and projections are defined in the lower surface of the upper board and adhesion to the encapsulating resin layer is enhanced is taken.

When a metal plate body is used as the upper board, it is possible to enhance the rigidity of upper portions of a plurality of semiconductor devices in a state in which the metal plate body is bonded onto its upper surface of the encapsulating resin layer and taken out from the corresponding die. It is therefore possible to hold the side of the metal plate body and easily process the back surface of the wiring board on its opposite side by polishing or the like. This is similar even after its division into fractions.

The above description has been made of the case in which the lower board and the upper board are larger than the encapsulating resin layer in thermal expansion coefficient. If, however, the thermal expansion coefficient of the upper board is set approximately identical to that of the lower board even where the thermal expansion coefficient of the lower board is smaller than that of the encapsulating resin layer, effects similar to the above can be obtained.

When, for example, a wiring board comprised of materials such as silicon (whose thermal expansion coefficient $\alpha_a=3\times10^{-6}/°$ C. or so), ceramic (aluminum oxide: $\alpha_a=7.3\times10^{-6}/°$ C. or so, and aluminum nitride: $\alpha_a=5\times10^{-6}/°$ C. or so), Pyrex (registered trademark: $\alpha_a=3\times10^{-6}/°$ C. or so), etc. is used as the lower board, an upper board formed of the same material or upper boards approximately identical in thermal expansion coefficient, selected from the above materials, or a metal plate or board comprised of alloy 42 (whose thermal expansion coefficient $\alpha_c=4.2\ 5\times10^{-6}/°$ C. or so) may be used as the upper board.

Since, in this case, the alloy 42 is easy to magnetize when the alloy 42 is used as the upper board, the magnetized alloy 42 may also be attached or applied to the bottom face of the upper board mounting hole of the upper die so as to be held at the bottom face.

While the preferred forms of the present invention have been described, it is to be understood that modifications will be apparent to those skilled in the art without departing from the spirit of the invention. The scope of the invention is to be determined solely by the following claims.

What is claimed is:

1. A semiconductor device comprising:
  a lower substrate having wiring patterns formed of a plurality of wirings;
  semiconductor chips located above the lower substrate and electrically connected to the wirings;
  an intermediate member which seals the semiconductor chips in columnar form and substantially; and
  an upper board which substantially covers the entire upper surface of the intermediate member,
  wherein a thermal expansion coefficient of the upper board is approximately identical to that of the lower substrate.

2. The semiconductor device according to claim 1, wherein the intermediate member has a thermal expansion coefficient smaller than that of the lower substrate.

3. The semiconductor device according to claim 2, wherein materials for the lower substrate and the upper board are identical to each other.

4. The semiconductor device according to claim 3 wherein thicknesses of the lower substrate and the upper board are approximately identical.

5. The semiconductor device according to claim 4, wherein the semiconductor chips are plural.

6. The semiconductor device according to claim 5, wherein the semiconductor chips are electrically connected to the wirings in a flip-chip system.

7. The semiconductor device according to claim 6, wherein the lower substrate comprises a glass epoxy resin, and the intermediate member comprises an epoxy resin.

8. The semiconductor device according to claim 1, wherein materials for the lower substrate and the upper board are identical to each other.

9. The semiconductor device according to claim 8, wherein the intermediate member has a thermal expansion coefficient smaller than that of the lower substrate.

10. The semiconductor device according to claim 9, wherein thicknesses of the lower substrate and the upper board are approximately identical.

11. The semiconductor device according to claim 10, wherein the semiconductor chips are plural.

12. The semiconductor device according to claim 11, wherein the semiconductor chips are electrically connected to the wirings in a flip-chip system.

13. The semiconductor device according to claim 12, wherein the lower substrate comprises a glass epoxy resin, and the intermediate member comprises an epoxy resin.

14. The semiconductor device according to claim 1, wherein thicknesses of the lower substrate and the upper board are approximately identical.

15. The semiconductor device according to claim 14, wherein the intermediate member has a thermal expansion coefficient smaller than that of the lower substrate.

16. The semiconductor device according to claim 15, wherein materials for the lower substrate and the upper board are identical to each other.

17. The semiconductor device according to claim 16, wherein the semiconductor chips are plural.

18. The semiconductor device according to claim 17, wherein the semiconductor chips are electrically connected to the wirings in a flip-chip system.

19. The semiconductor device according to claim 18, wherein the lower substrate comprises a glass epoxy resin, and the intermediate member comprises an epoxy resin.

* * * * *